United States Patent [19]

Hess

[11] 4,045,394
[45] Aug. 30, 1977

[54] VISCOSITY STABILIZATION OF VICINAL ACRYLOXY HYDROXYL DERIVATIVES OF LINSEED OIL WITH N-ALKYLMORPHOLINES

[75] Inventor: Lawrence George Hess, Charleston, W. Va.

[73] Assignee: Union Carbide Corporation, New York, N.Y.

[21] Appl. No.: 694,202

[22] Filed: June 9, 1976

[51] Int. Cl.$^2$ ............................................. C08F 2/46
[52] U.S. Cl. ........................... 260/23 AR; 204/159.11; 204/159.19; 204/159.22; 204/159.23; 260/23 EP; 260/45.8 NZ; 260/405

[58] Field of Search ................... 260/23 EP, 45.8 NZ, 260/23 AR, 405; 204/159.23, 159.22, 159.11, 159.19

[56] References Cited

U.S. PATENT DOCUMENTS

| | | | |
|---|---|---|---|
| 3,125,592 | 3/1964 | Nevin | 260/23 AR |
| 3,224,989 | 12/1965 | Nevin | 260/23 AR |
| 3,256,225 | 6/1966 | Nevin | 260/23 EP |
| 3,304,315 | 2/1967 | Nevin | 260/23 AR |
| 3,959,222 | 5/1976 | De La Mare | 204/159.23 |
| 3,966,573 | 6/1976 | Bean | 204/159.23 |

*Primary Examiner*—Eugene C. Rzucidlo
*Attorney, Agent, or Firm*—Peter R. Shearer

[57] ABSTRACT

N-Alkylmorpholines are used as viscosity stabilizers in vicinal acryloxy hydroxyl derivatives of linseed oil.

4 Claims, No Drawings

VISCOSITY STABILIZATION OF VICINAL ACRYLOXY HYDROXYL DERIVATIVES OF LINSEED OIL WITH N-ALKYLMORPHOLINES

BACKGROUND OF THE INVENTION

U.S. Pat. No. 3,224,989 discloses polymerizable long chain fatty oil, fatty acid and fatty acid ester compounds having vicinal acryloxy and hydroxyl groups. Recently, it has been found that such compounds are particularly useful as substituents of so-called "100 percent solids" radiation curable coatings and inks. These coatings and inks, which contain no volatile solvents, are comprised of one or more of the aforesaid compounds, and photoinitiators, and they polymerize upon exposure to radiation to form solid coatings or inks. Such coatings and inks are advantageous to use, since curing them does not require the application of heat and the associated release of volatile solvents into the atmosphere, yet they can be applied to substrates using conventional liquid film application methods. In order to conveniently apply such coatings and inks, it is desirable that all the substituents have relatively stable viscosities. A problem has been observed in the use of certain of the aforesaid vicinal acryloxy hydroxyl compounds in that the viscosities of the compounds have increased during prolonged periods of storage. In particular, vicinal acryloxy hydroxyl derivatives of linseed oil have increased in viscosity by as much as 3,000 to 6,000 cps (measured at 100° F.) after room temperature storage for periods of 1 to 5 months. Such viscosity increases during storage are highly undesirable when the compounds are to be employed in coatings or inks, since they would necessitate viscosity adjustment at the time of use by altering the coating or ink composition, with resultant changes in properties of the composition, or adjustment of coating equipment to account for viscosity variations in the coatings or inks.

SUMMARY OF THE INVENTION

This invention is directed to a method of stabilizing the viscosity of vicinal acryloxy hydroxyl derivatives of linseed oil. It has been discovered that the addition of a N-alkylmorpholine to the said acryloxy hydroxyl derivatives greatly inhibits viscosity increases in the compounds, yet does not adversely affect the utility of the compounds in radiation curable coating and ink formulation.

DESCRIPTION OF THE INVENTION

The vicinal acryloxy hydroxyl derivatives which can be advantageously treated by the stabilizer of the present invention are known in the art and are described in U.S. Pat. No. 3,224,989, the teachings of which are incorporated herein by reference. Disclosed therein is a class of vicinal acryloxy hydroxyl compounds characterized by two structural features: (1) at least one long aliphatic chain having from 10 to 24 carbon atoms, and (2) at least one hydroxy alkyl ester group represented by the formula:

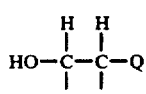

(I)

wherein Q is a monovinylated acryloxy radical and the linked pair of carbon atoms is a segment of a characterizing long aliphatic chain. In particular, the compounds to which the present invention pertains are any of the disclosed compounds in which the long aliphatic chains are segments of linseed oil molecules. These are generally prepared by (a) epoxidation of the double bonds in the long aliphatic chains by any of the known methods, such as oxidation with peracetic, perbenzoic, performic or monoperphthalic acid and (b) reaction of the epoxidized linseed oil with an acryloxy compound, such as acrylic or methacrylic acid. The reaction (b) occurs at the oxirane groups formed in reaction (a) and produces the functional groups shown in formula (I). Each molecule of the vicinal acryloxy hydroxyl derivative of linseed oil contains an average of from 1 to 9 functional groups as shown in formula (I). For purposes of this invention, the definition of vicinal acryloxy hydroxyl derivative of linseed oil includes mixtures of said compounds with a small amount, that is, generally less than 1 weight percent, of unreacted acrylic or methacrylic acid. Those skilled in the art will recognize that such mixtures are generally obtained as the product of the reaction of step (b) above. Additionally, there can be present in the usual concentrations known to those skilled in the art any conventional vinyl polymerization inhibitor, residual catalyst or any additive conventionally employed in the preparation of the subject compounds.

The stabilizers of this invention are the N-akylmorpholines of the formula:

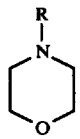

wherein R is alkyl having from 1 to 4 carbon atoms.

The stabilizer is present in an amount sufficient to stabilize the vicinal acryloxy hydroxyl derivative of linseed oil against an increase in viscosity. While not wishing to be bound by a particular theory of the mechanism, it is believed that the viscosity increase of the unstabilized compounds of this invention is due to crosslinking reactions in which the residual acrylic or methacrylic acid and the unreacted oxirane groups of the vicinal acryloxy hydroxyl derivatives participate. Accordingly, it has been observed that the stabilizer is effective when it is present in an amount of from 0.2 to 1.6 moles per mole of residual acrylic and methacrylic acid.

To stabilize the vicinal acryloxy hydroxyl derivative of linseed oil, the N-alkylmorpholine is added thereto by any convenient means for achieving complete admixture. Temperature of addition is not critical and usually, the vicinal acryloxy hydroxyl derivative is brought to a somewhat elevated temperature, that is, from about 40° to 80° C. when adding the N-alkylmorpholine to increase fluidity, thereby facilitating the mixing.

It was observed that the addition of N-alkylmorpholine to vicinal acryloxy hydroxyl derivatives of linseed oil which were subsequently employed in radiation curable ink compositions did not increase cure time and the uncured inks had fountain solution compatibility test values similar to those for inks which used the unstabilized vicinal acryloxy hydroxyl derivatives. Moreover, the presence of N-alkylmorpholine does not inhibit the effectiveness of vinyl polymerization inhibitors which are usually present in the vicinal acryloxy hydroxyl derivatives of linseed oil.

The examples which follow are intended to further illustrate the invention and are not to be construed as limiting it in any way.

In the examples, the following procedures were used to determine the weight percent residual acrylic acid and oxirane oxygen content of the vicinal acryloxy hydroxyl derivatives of linseed oil.

Acrylic acid

About 10g. of the sample being tested was dissolved in 50 ml. of anhydrous isopropanol. Three or four drops of bromothymol blue indicator were added to the mixture. The mixture was then titrated with standardized alcoholic potassium hydroxide solution to a blue-green endpoint and the acrylic acid content was calculated according to the following equation:

$$\frac{\text{ml. standardized solution}}{\text{wt. of sample (g.)}} \times \frac{\text{standardized solution normality}}{\text{wt. of sample (g.)}} \times 7.2 = \text{wt. \% acrylic acid}$$

Oxirane oxygen

Solution A was prepared by dissolving about 11 g. of tetraethyl ammonium bromide in 100 ml. of a 42% acetic acid-in-chlorobenzene solution, adding three or four drops of crystal violet indicator and adding 2½ to 3 grams of the sample being tested. A second solution, solution B, which was a one-tenth Normal solution of perchloric acid in acetic acid, was used to titrate solution A to a blue-green endpoint. The oxirane content was then calculated by the equation:

$$\frac{\text{ml. sol'n. B} \times \text{sol'n. B normality} \times 1.6}{\text{wt. of sample (g.)}} = \text{wt. \% oxirane oxygen}$$

The fountain solution compatibility test of Example 5 is intended to determine the compatibility of radiation curable inks containing acrylated epoxidized linseed oil with fountain solutions used in commercial offset printing. In the test, a fountain solution is prepared as a mixture of 25 weight percent isopropyl alcohol and 75 weight percent distilled water. A 50/50 weight mixture of fountain solution and radiation curable ink composition is placed in a vial and stirred with a laboratory stirrer at about 1900 rpm for 3 minutes. The supernatent fountain solution is drained from the vial and the amount of fountain solution taken up by the radiation curable ink composition is determined by measuring the difference between the weight of the remaining liquid and the weight of radiation curable ink composition initially placed in the vial. It is generally desirable that the radiation curable ink composition take up as little fountain solution as possible.

COMPARATIVE EXAMPLE

To show the viscosity increases which occur in vicinal acryloxy hydroxyl derivatives of linseed oil that have not been treated by the method of this invention, a series of four acrylated epoxidized linseed oils were stored in one-quart containers at room temperature (25°–28° C.). Viscosity measurements were made after various periods of storage using a Cannon-Fenske capillary viscometer. Results are reported in the table below. The samples had an average of about 2.8 acrylyl groups per molecule. There was present in each sample, as a vinyl polymerization inhibitor, either N,N-diethylhydroxylamine (DEHA) or a mixture of two parts triphenylphosphite (TPP) to one part hydroquinone (HQ) in the amounts indicated in the table. The amount of residual acrylic acid present and the oxirane oxygen content are indicated as weight percentages. Viscosities of the acrylated epoxidized linseed oil samples were measured at 100° F.

| Sample | Storage Time | Inhibitor, ppm TPP+HQ | Inhibitor, ppm DEHA | Viscosity, cps. | Acrylic acid, Wt. % | Oxirane Oxygen Wt. % |
|---|---|---|---|---|---|---|
| I | Initial | 600 | — | 23,691 | 0.42 | 1.73 |
| I | 5 mos. | 600 | — | 30,102 | 0.14 | 0.98 |
| I | Initial | — | 559 | 23,840 | 0.42 | 1.73 |
| I | 5 mos. | — | 559 | 29,622 | 0.12 | 0.95 |
| II | Initial | 600 | — | 12,848 | 0.66 | 2.16 |
| II | 2 mos. | 600 | — | 15,306 | 0.40 | 1.23 |
| II | 4 mos. | 600 | — | 16,076 | 0.20 | — |
| II | Initial | — | 500 | 14,827 | — | — |
| II | 2 mos. | — | 500 | 18,124 | — | — |
| II | 4 mos. | — | 500 | 19,089 | — | — |
| III | Initial | — | 500 | 11,497 | 0.60 | 2.35 |
| III | 5 weeks | — | 500 | 14,638 | 0.39 | 1.28 |
| IV | Initial | — | 500 | 8,967 | 0.54 | 2.31 |
| IV | 5 weeks | — | 500 | 11,787 | 0.16 | 1.34 |
| IV | 10 weeks | — | 500 | 12,278 | 0.13 | — |
| IV | 15 weeks | — | 500 | 12,241 | 0.04 | — |

EXAMPLE 1

Three tertiary amines—N-methylmorpholine, triethanolamine and bis(2-dimethylamino)ethyl ether— were each added to samples of an acrylated epoxidized linseed oil having an average of 2.8 acrylyl groups per molecule, 0.44 weight percent residual acrylic acid, and an oxirane oxygen content of 1.7 weight percent and 500 ppm diethylhydroxylamine were added thereto as a vinyl polymerization inhibitor. In each case, the tertiary amine was added in an amount such that the molar ratio of tertiary amine to residual acrylic acid was 1:1. The capillary viscosity of each of the acrylated epoxidized linseed oil samples containing the teritiary amines was tested (Cannon-Fenske capillary viscometer) at 100° F., and then the samples were placed in 1 pint containers and stored at 27° C. for 4 months. Viscosity measurements were made again after 1, 3 and 4 months of storage. The results are reported in the table below, wherein they are compared with the results of a similar test using the same acrylated epoxidized linseed oil containing no tertiary amine additive. Only the sample treated with N-methylmorpholine did not exhibit a viscosity increase beyond its initial value during the 4 month storage.

| Tertiary amine added | Viscosity, cps | | | |
|---|---|---|---|---|
| | Initial | 1 mo. | 3 mo. | 4 mo. |
| None | 23,492 | 26,991 | 27,068 | 26,321 |
| N-methylmorpholine | 23,942 | 22,973 | 23,735 | 23,230 |
| Triethylanolamine | 23,492 | 26,275 | 25,149 | 23,890 |
| Bis(2-dimethyl-amino) ethyl ether | 23,492 | 26,038 | 27,304 | 27,706 |

EXAMPLE 2

N-methylmorpholine was added to samples of acrylated epoxidized linseed oil containing varying concentrations of residual acrylic acid. Each of the acrylated epoxidized linseed oils had an average of about 2.8 acrylyl groups per molecule and contained 500 ppm diethylhydroxylamine as vinyl polymerization inhibitor. The initial capillary viscosities of the samples were measured (Cannon-Fenske capillary viscometer at 100° F.) and the samples were stored in an oven in 2-ounce containers at 60° C. Capillary viscosities were measured again after 17, 41 and 65 hours of storage. The results appear in the table below. The amount of N-methylmorpholine added is indicated as the molar ratio of N-methylmorpholine to residual acrylic acid. In each case, the treated samples exhibited less viscosity increase than the untreated samples.

| Acrylic acid, wt % | N-methylmorpholine, molar equivalents of residual acrylic acid | Initial | 17 hrs. | 41 hrs. | 65 hrs. |
|---|---|---|---|---|---|
| 1.10 | None | 14,723 | 16,533 | 18,412 | 20,077 |
| | 1.0 | 15,604 | 15,817 | 16,150 | 16,488 |
| | 0.5 | 15,523 | 16,270 | 17,724 | 18,158 |
| | 1.5 | 14,746 | 14,899 | 15,143 | 15,405 |
| 0.72 | None | 17,080 | 17,685 | 19,571 | 20,826 |
| | 1.0 | 17,006 | 16,405 | 17,776 | 18,157 |
| 0.40 | None | 19,659 | 19,715 | 21,432 | 22,446 |
| | 1.0 | 19,301 | 18,948 | 20,769 | 20,889 |

EXAMPLE 3

N-methylmorpholine was added to an acrylated epoxidized linseed oil at varying concentrations. The acrylated epoxidized linseed oil contained 0.45 weight percent residual acrylic acid, 2.1 weight percent oxirane oxygen and an average of about 2.8 acrylyl groups per molecule. As indicated in the table below, one series of additions was made to the acrylated epoxidized linseed oil having 500 ppm diethylhydroxylamine added as vinyl polymerization inhibitor and another series of additions was made to acrylated epoxidized linseed oil having 550 ppm triphenylphosphite and 50 ppm hydroquinone added as vinyl polymerization inhibitor. The amount of N-methylmorpholine added in each case is indicated in the table below as the mole ratio of N-methylmorpholine to residual acrylic acid present in the acrylated epoxidized linseed oil being treated. After measuring the initial capillary viscosity of each sample (Cannon-Fenske capillary viscometer at 100° F.), a portion of each sample was placed in a 4 ounce container and stored at 27° C. for 1 month and its viscosity was measured again. Another portion of each sample was placed in a 2 ounce container and stored in an oven at 60° C. for 120 hours and its capillary viscosity was measured after 65 hours and 120 hours of storage.

| Polymerization inhibitor | N-methylmorpholine, molar equivalents of residual acrylic acid | Initial | 1 mo. at 27° C. | 65 hrs. at 60° C. | 120 hrs. at 60° C. |
|---|---|---|---|---|---|
| DEHA | 0.0 | 11,886 | 12,092 | 12,920 | 13,405 |
| | 1.59 | | 12,796 | 11,120 | 11,110 |
| | 1.27 | | 12,016 | 11,392 | 11,785 |
| | 1.03 | | 12,872 | 11,834 | 11,978 |
| | 0.79 | | 11,951 | 12,033 | 12,049 |
| | 0.56 | | 12,894 | 12,211 | 12,228 |
| | 0.31 | | 11,887 | 12,392 | — |
| TPP-HQ | 0.0 | 11,886 | 12,212 | 13,570 | 13,487 |
| | 1.59 | | 12,049 | 11,392 | 13,196 |
| | 1.27 | | 12,298 | 11,625 | 12,090 |
| | 1.03 | | 12,029 | 11,816 | 12,016 |
| | 0.79 | | 12,277 | 12,523 | 12,465 |
| | 0.56 | | 12,059 | 12,718 | 12,799 |
| | 0.31 | | 12,198 | 12,554 | 12,837 |

EXAMPLE 4

A series of four radiation curable ink compositions, identified A, B, C and D, were prepared using acrylated epoxidized linseed oil having an average of 2.8 acrylyl groups per molecule. The acrylated epoxidized linseed oils used in A and B contained 550 ppm triphenylphosphite and 50 ppm hydroquinone as vinyl polymerization inhibitor, and had 0.36 weight percent residual acrylic acid and 1.67 weight percent oxirane oxygen. Additionally, the acrylated epoxidized linseed oil used in B contained a molar amount of N-methylmorpholine equal to the molar amount of residual acrylic acid present. The acrylated epoxidized linseed oils used in C and D contained 500 ppm diethyoxyhydroxylamine as vinyl polymerization inhibitor, and had 0.36 weight percent residual acrylic acid and 1.67 weight percent oxirane oxygen. Additionally, the acrylated epoxidized linseed oil used in D contained a molar amount of N-methylmorpholine equal to the molar amount of acrylic acid present. The radiation curable ink compositions were prepared by mixing the following components:

| | p.b.w. |
|---|---|
| Acrylated epoxidized linseed oil | 60 |
| Pentaerythritol triacrylate | 20 |
| Carbon black pigment | 10 |
| Triphenylmethane monosulfonic acid | 2 |
| Benzophenone | 7 |
| Michler's Ketone | 1 |

Each of the radiation curable ink compositions was tested for Brookfield RVT viscosity at 25° C. using a No. 7 spindle at 50 rpm. The results appear in the table below. A sample of each radiation curable ink composition was transferred onto printing paper by a hand roller to simulate offset printing. Radiation curable ink compositions A, B and C were cured to a dry, solid state on the printing paper by 0.425 seconds exposure in air to ultraviolet light from a medium pressure mercury arc lamp which delivered a flux of about 800 watts/sq. ft. to the paper surface. Radiation curable ink composition D cured to a dry, solid state after 0.283 seconds exposure to the same lamp. A second set of radiation curable ink samples was transferred to printing paper and cured by exposure in air to the same medium pressure mercury arc lamp used above, followed by exposure in a nitrogen atmosphere to light of substantially all 2537 Angstrom units wavelength at a delivered flux of 65 watts/sq. ft. All of the radiation curable inks cured to a dry, solid state after 0.106 seconds exposure to the 800 watts/sq. ft. radiation and 0.3 seconds exposure to the 65 watts/sq. ft. radiation. Each of the radiation curable ink compositions also were subjected to the fountain solution compatibility test. The results are reported in the table below as grams of fountain solution taken up per 100 grams of radiation curable ink composition.

| Sample | A | B | C | D |
|---|---|---|---|---|
| Viscosity, poise | 504 | 504 | 512 | 464 |
| Fountain solution compatibility | 39 | 40 | 38 | 48 |

The results of this example show that that addition of N-alkylmorpholine to acrylated epoxidized linseed oil does not substantially impair its performance in radiation curable ink compositions. Although the fountain solution compatibility of composition D, containing N-alkylmorpholine, was somewhat higher than that of composition C, which contained no N-alkylmorpholine, a composition which was similar to composition D, but contained 63 parts of the acrylated epoxidized linseed oil and 17 parts of pentaerythritol triacrylate, had a fountain solution compatibility of only 43.

What is claimed is:

1. A composition comprising a vicinal acryloxy hydroxyl derivative of linseed oil and an amount sufficient to stabilize said composition against viscosity increases of an N-alkylmorpholine, wherein the alkyl unit contains from 1 to 4 carbon atoms.

2. A composition as claimed in claim 1, wherein the amount of N-alkylmorpholine present is from 0.2 to 1.6 moles per mole of residual acrylic and methacrylic acid present in the acryloxy hydroxyl derivative of linseed oil.

3. A composition as claimed in claim 1, wherein the said N-alkylmorpholine is N-methylmorpholine.

4. A composition as claimed in claim 2, wherein the said N-alkylmorpholine is N-methylmorpholine.

* * * * *